United States Patent
Fonstad, Jr. et al.

(10) Patent No.: US 6,455,398 B1
(45) Date of Patent: Sep. 24, 2002

(54) SILICON ON III-V SEMICONDUCTOR BONDING FOR MONOLITHIC OPTOELECTRONIC INTEGRATION

(75) Inventors: Clifton G. Fonstad, Jr., Arlington; Joanna M. London, Charlestown, both of MA (US); Joseph F. Ahadian, Beaverton, OR (US)

(73) Assignee: Massachusetts Institute of Technology, Cambridge, MA (US)

(*) Notice: Subject to any disclaimer, the term of this patent is extended or adjusted under 35 U.S.C. 154(b) by 0 days.

(21) Appl. No.: 09/616,456

(22) Filed: Jul. 14, 2000

Related U.S. Application Data
(60) Provisional application No. 60/144,114, filed on Jul. 16, 1999.

(51) Int. Cl.[7] .......................... H01L 21/30; H01L 21/46
(52) U.S. Cl. ....................................... 438/459; 438/455
(58) Field of Search .................................. 438/455, 459

(56) References Cited

U.S. PATENT DOCUMENTS

| | | | |
|---|---|---|---|
| 5,281,834 A | 1/1994 | Cambou et al. | |
| 5,346,848 A | 9/1994 | Grupen-Shemansky et al. | |
| 5,373,184 A | 12/1994 | Moslehi | |
| 5,386,137 A | 1/1995 | Dell et al. | |
| 5,407,856 A | 4/1995 | Quenzer et al. | |
| 5,472,914 A | 12/1995 | Martin et al. | |
| 5,502,316 A | 3/1996 | Kish et al. | |
| 5,503,704 A | * 4/1996 | Bower et al. | 156/281 |
| 5,523,602 A | 6/1996 | Horiuchi et al. | |
| 5,557,120 A | 9/1996 | Martin et al. | |
| 5,606,186 A | 2/1997 | Noda | |
| 5,728,623 A | 3/1998 | Mori | |
| 5,728,624 A | * 3/1998 | Linn et al. | 438/459 |
| 5,849,627 A | 12/1998 | Linn et al. | |
| 5,858,855 A | 1/1999 | Kobayashi | |
| 5,966,622 A | * 10/1999 | Levine et al. | 438/459 |
| 6,004,867 A | 12/1999 | Kim et al. | |
| 6,030,884 A | 2/2000 | Mori | |
| 6,074,892 A | 6/2000 | Bowers et al. | |
| 6,153,495 A | * 11/2000 | Kub et al. | 438/459 |
| 6,180,496 B1 | * 1/2001 | Farrens et al. | 438/455 |

FOREIGN PATENT DOCUMENTS

| | | |
|---|---|---|
| DE | 42 10859 C1 | 6/1993 |
| EP | 0 797 248 A2 | 9/1997 |

OTHER PUBLICATIONS

Lehmann et al, "Bubble–Free wafer Bonding of GaAs and InP on Silicon in a Microcleanroom", Jpn. J. Appl. Phys., Part 2, vol. 28(12), L2141–2143(1989).*

Krishnamoorthy et al., "Photonic page Buffer Based on GaAs MQW Modulators Bonded Directly over Active Silicon Complementary–Metal–Oxide–semiconductor (CMOS) circuits", Applied optics, vol. 35(14(, p 1439(1996).*

(List continued on next page.)

*Primary Examiner*—Michael Sherry
*Assistant Examiner*—Asok Kumar Sarkar
(74) *Attorney, Agent, or Firm*—Theresa A. Lober

(57) ABSTRACT

In a method for bonding a silicon substrate to a III-V material substrate, a silicon substrate is contacted together with a III-V material substrate and the contacted substrates are annealed at a first temperature that is above ambient temperature, e.g., at a temperature of between about 150° C. and about 350° C. The silicon substrate is then thinned. This bonding process enables the fabrication of thick, strain-sensitive and defect-sensitive optoelectronic devices on the optimum substrate for such, namely, a thick III-V material substrate, while enabling the fabrication of silicon electronic devices in a thin silicon layer, resulting from the thinned Si substrate, that is sufficient for such fabrication but which has been thinned to eliminate thermally-induced stress in both the Si and III-V materials. The III-V material substrate thickness thereby provides the physical strength of the composite substrate structure, while the thinned silicon substrate minimizes stress in the composite structure.

27 Claims, 9 Drawing Sheets

OTHER PUBLICATIONS

Wada et al., "Wafer–Bonding of InP to Si and its Application to Optical Devices", Jpn. J. App. Phys., vol. 37 (3B), p 1383(1998).*

Lee et al., "Direct Bondingof Gallium Arsenide on Silicon", Jpn. J. Appl. Phys., part 1, No. 7A, p 4041(1999).*

Ersen et al., "Direct bonding of GaAs films on silicon circuits by epitaxial liftoff," *Solid State Electronics*, vol. 36, No. 12, pp. 1731–1739, Dec. 1993.

London, et al., "Si–on GaAs: Monolithic Heterogeneous Integration of Si CMOS with GaAs Optoelectronic Devices using EoE, SOI, and MEMS Techniques," *Microsystems Technology Laboratory Annual Report*, Massachusetts Institute of Technology, p. 174, May 1998.

Kopperschmidt et al., "Materials integration of gallium arsenide and silicon by wafer bonding," *Applied Phys. Lett.*, vol. 72, No. 24, pp. 3181–3183, Jun. 1998.

London et al., "Silicon–on–gallium arsenide wafers for monolithic optoelectronic integration," presentation absts, p. 312, Materials Research Society Spring Meeting, San Francisco, CA, Apr. 1999.

London "Wafer Bonding for Monolithic Integration of Si CMOS VLSI Electronics with III–V Optoelectronic Devices," S.M. Thesis, Massachusetts Institute of Technology, Jun. 1999.

London, et al., "Preparation of Silicon–on–Gallium Arsenide Wafers for Monolithic Optoelectronic Integration," *IEEE Photonics Tech. Lett.*, vol. 11, No. 8, pp. 958–960, Aug. 1999.

London, et al., "Si–on GaAs: Monolithic Heterogeneous Integration of Si CMOS with GaAs Optoelectronic Devices using EoE, SOI, and MEMS Techniques," *Microsystems Technology Laboratory Annual Report*, Massachusetts Institute of Technology, May 1999.

London et al., "Silicon–on–Gallium Arsenide Wafers: An Optimal Substrate for Quantum Well Heterostructures and Monolithic Optoelectronic Integration," Late news presentation abst., Electronic Materials Conference, Santa Barbara, CA, Jul. 1999.

London et al., "Quantum well heterostructures grown by molecular beam epitaxy on silicon–on–gallium arsenide substrates," *Applied Phys. Lett.*, vol. 75, No. 22, Nov. 1999.

Lee et al., "Direct bonding of Gallium Arsenide on Silicon," *Jpn. J. Appl. Phys.*, vol. 38, Part 1, No. 7A, pp. 4041–4042, Jul. 1999.

Krishnamoorthy et al., Photonic page buffer based on GaAs multiple–quantum–well modulators bonded directly over active silicon complementary–metal oxide–semiconductor (CMOS) circuits, *Applied Optics*, vol. 35, No. 14, pp. 2439–2448, May 1996.

* cited by examiner

SILICON ON III-V SEMICONDUCTOR BONDING FOR MONOLITHIC OPTOELECTRONIC INTEGRATION

This application claims the benefit of U.S. Provisional Application No. 60/144,114, filed Jul. 16, 1999, the entirety of which is hereby incorporated by reference.

STATEMENT REGARDING FEDERALLY SPONSORED RESEARCH

This invention was made with Government support under Contract No. DAAG55098-1-0320, awarded by the ARO. The Government has certain rights in the invention.

BACKGROUND OF THE INVENTION

This invention relates generally to silicon (Si) and III-V compound semiconductor microfabrication processes, and more particularly relates to processes enabling the monolithic integration of electronic and optoelectronic silicon and III-V semiconductor devices.

It is well recognized that the monolithic integration of silicon integrated electronic circuits and III-V semiconductor electronic and optical devices is an important technological challenge for enabling a wide range of applications. For example, monolithic integration of III-V laser diodes and p-i-n detectors with high density, high performance silicon complementary metal oxide semiconductor (CMOS) circuitry is desired to produce robust optoelectronic integrated circuits. Much research has been directed in particular to Si integration with the III-V compound gallium arsenide (GaAs) due to wide applicability of GaAs for high performance optical and electronic devices.

Historical efforts to monolithically integrate GaAs with Si have largely focused on the heteroepitaxial growth of GaAs on a silicon substrate. Only limited success has resulted for such heteroepitaxial growth, however, due to the lattice constant mismatch between Si and GaAs. This Si-GaAs lattice constant mismatch inhibits the ability to produce an abrupt and defect free interface of one material grown on the other. Lattice constant mismatch exists between Si and other III-V materials as well and in general is understood to limit the success of heteroepitaxial processing.

Aside from lattice constant mismatch, a more difficult materials processing challenge is posed by the very large difference in thermal expansion coefficient between Si and most III-V materials such as GaAs. GaAs is characterized by a thermal expansion coefficient that is much larger than that of Si; as a result, a GaAs layer expands more than a Si layer when exposed to an increase in temperature. During cooling of composite GaAs/Si layers, the increased contraction rate of the GaAs layer over that of the Si layer produces stress that can cause materials defects at the interface of the two layers and that can cause lattice distortion in the bulk of the two materials. In general, the densities of such bulk and interface defects are unacceptable for typical device applications, including optoelectronic device applications.

While there have been proposed a range of techniques for reducing the number and impact of Si/III-V interface defects generated due to lattice constant mismatch, it is currently very difficult to suppress or to accommodate the very large stresses and associated defects that are induced in III-V epitaxial layers on Si by even relatively small temperature changes. But many conventional microfabrication techniques for producing Si CMOS devices generally require high-temperature processing steps.

Various techniques for bonding III-V materials and Si have been proposed for overcoming lattice constant mismatch and thermal expansion coefficient differences. These techniques generally require complicated configurations of stress relief interface layers and/or employ only low-temperature bonding processes that result in suboptimal strength of composite structures. Efforts at monolithic integration of Si and III-V materials have been hampered by the complexity, restrictions, and limitations of these proposed bonding processes.

SUMMARY OF THE INVENTION

The invention provides processes that enable robust bonding of Si and III-V materials in a manner that accommodates formation of electronic and optoelectronic devices on the materials and that accommodates monolithic microfabrication processing on the bonded materials. In accordance with the invention, a silicon substrate is contacted together with a III-V material substrate and the contacted substrates are annealed at a first temperature that is above ambient temperature, e.g., at a temperature of between about 150° C. and about 350° C. The silicon substrate is then thinned.

The silicon substrate can be provided as, e.g., a silicon-on-insulator (SOI) substrate configuration, a separation-by-implantation-of-oxygen (SIMOX) substrate configuration, or other selected configuration, preferably accommodating thinning of the silicon substrate. The III-V material substrate can be provided as, e.g., a GaAs substrate, an InP substrate, or other selected III-V substrate.

The bonding process provided by the invention enables the fabrication of thick, strain-sensitive and defect-sensitive optoelectronic devices on the optimum substrate for such, namely, a thick III-V material substrate, while enabling the fabrication of Si electronic devices in a thin Si layer, resulting from the thinned Si substrate, that is sufficient for such fabrication but which has been thinned to eliminate thermally-induced stress in both the Si and III-V materials. The III-V material substrate thickness thereby provides the physical strength of the composite substrate structure, while the thinned silicon substrate minimizes stress in the composite structure.

In accordance with the invention, silicon electronic devices can be fabricated on the silicon substrate before contacting the silicon substrate with the III-V material substrate, and silicon electronic devices further can be fabricated on the silicon layer resulting from thinning of the silicon substrate. Similarly, III-V material electronic devices can be fabricated on the III-V material substrate before contacting the III-V material substrate with the silicon substrate, and III-V material electronic devices can further be fabricated on the III-V substrate after thinning of the silicon substrate. An electrical interconnection can be fabricated between the silicon and III-V material electronic devices. III-V material optical devices can be fabricated on the III-V material substrate before contacting the III-V material substrate with the silicon substrate, and III-V material optical devices further can be fabricated on the III- V substrate after thinning of the silicon substrate. Such optical device fabrication can include, e.g., growth of a heteroepitaxial layer on the III-V material substrate.

In accordance with the invention, a dielectric layer can be formed on at least one of the silicon and III-V material substrate surfaces to be contacted together. Preferably, a dielectric layer is formed on both the silicon and III-V material substrate surfaces to be contacted together. The dielectric layer can be provided as, e.g., an oxide layer, a nitride layer, or other suitable layer.

Further in accordance with the invention, the silicon and III-V material substrate surfaces to be contacted can be rendered hydrophilic. During contacting together of the surfaces, pressure can be applied to the silicon and III-V material substrates.

Thinning of the silicon substrate can be carried out e.g., to thin the silicon substrate to a thickness less than about 1 micron. Preferably the silicon substrate is thinned to a thickness less than about 5000 angstroms, and more preferably, the silicon substrate is thinned to a thickness less than about 2000 angstroms.

After the silicon substrate is thinned, in accordance with the invention the III-V material substrate and the thinned silicon substrate can be annealed at a second temperature that is greater than the first temperature. The second anneal temperature can be, e.g., greater than about 200° C., more preferably, greater than about 350° C. The second anneal temperature can also be that temperature at which further thermal processing of the substrates is to be carried out.

The bonding process of the invention enables monolithic integration of Si electronics, e.g., CMOS electronics, with high-performance III-V material optoelectronic devices such as laser diodes and photodetectors as well as III-V material electronic devices such as MESFET and HEMT devices, in a configuration that is mechanically robust to thermal processing. As a result, a wide range of applications, including communications and optical systems, are well-addressed by the invention.

Other features and advantages of the invention will be apparent from the following detailed description and accompanying drawings, and from the claims.

DETAILED DESCRIPTION OF THE INVENTION

Figure 1A:
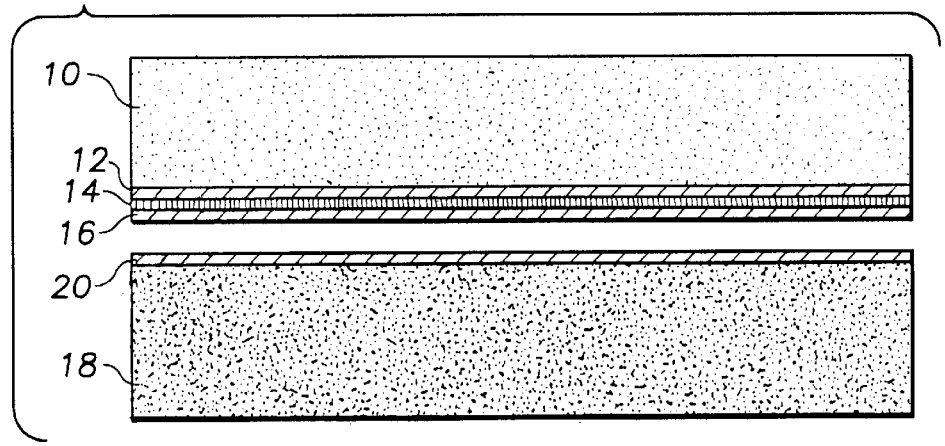
FIGS. 1A–1G are schematic cross-sectional views of a silicon substrate and a III-V material substrate at various stages of a first example process provided by the invention for bonding the silicon substrate and the III-V material substrate, with silicon electronic devices and III-V material optical devices fabricated after the bonding, in accordance with the invention.

Referring to FIG. 1A, there is shown a cross-sectional diagram of the starting wafers employed in a first bonding process provided by the invention. As shown in the figure, a silicon substrate 10 is provided to be bonded with a III-V material substrate 18, e.g., a GaAs wafer, for enabling monolithic microfabrication on each of the two materials. The GaAs substrate described here is meant as an example only; as explained in detail below, the invention contemplates a wide range of III-V materials to be employed. Each of the Si and III-V substrates to be bonded can be provided with generally any convenient configuration, e.g., as conventional microfabrication wafers, or as another stand-alone structure. Whatever configuration is selected, preferably the substrates are each of a thickness sufficient for handling and cleaning, e.g., at least about 200 μm in thickness. The substrates are also preferably provided with doping levels suitable for an intended microfabrication process. For example, the GaAs substrate can be provided as a semi-insulating, p-type, or n-type substrate, and the Si substrate can be provided with n-type or p-type doping as-prescribed for devices to be fabricated. The back side of the III-V material substrate can be coated with a selected encapsulation layer, in the conventional manner, to inhibit desorption of the III-V material during processing.

At least one, or both, of the two substrates to be bonded is designated to be thinned, and if desired for a given thinning process to be employed, is provided with a configuration for enabling thinning of that substrate. In one example, as shown in FIG. 1A, the silicon substrate is provided with an etch stop layer 12 that enables etching of the silicon substrate down to the etch stop layer, below which a further silicon layer 14 is provided. In a convenient configuration, such an etch stop layer can be provided as a silicon dioxide layer, e.g., in a silicon-on-insulator (SOI) wafer, or through separation by implantation of oxygen (SIMOX) configurations. The example illustrated in FIG. 1A reflects a SIMOX configuration. Here a SIMOX wafer of, e.g., about 550 μm in total thickness includes a buried silicon dioxide etch stop layer 12 (BOX) of about 370 nm in thickness and a silicon top layer 14 of about 200 nm in thickness. The etch stop layer can be of substantially any thickness that enables selectivity to a selected bulk substrate etch and that itself can then be removed. The invention contemplates a wide range of etch stop layer formation techniques. For example, bonding together of the oxide layers of two silicon wafers can be carried out to produce a buried oxide layer. In addition, implantation, thermal diffusion, or other buried etch stop formation process can be employed. As explained in detail below, an etch stop layer is not in general required by the invention, but can be preferred for many application as a means for enabling highly precise definition of a silicon layer thickness.

For many applications, it can be preferable to provide dielectric films 16, 20, on one or both of the top silicon layer 14 and the surface of the III-V substrate 18, respectively. The dielectric films can be provided to enhance planarity and bonding between the Si and III-V substrates, and as described in detail below, to provide electrical isolation between devices on the two substrates. Preferably the dielectric films, if employed, bond to each other to some degree at ambient temperature, e.g., by Van der Waals or hydrophilic forces.

The dielectric film on the Si substrate can be provided as a multi-layer film, e.g., as a layer of borophosphosilicate glass (BPSG) deposited atop a wet or dry thermal oxide layer. In one example, the wet or dry thermal oxide layer is of a thickness of about 150 nm and the BPSG layer is of a thickness of about 500 nm. Preferably the deposited BPSG layer is densified in the conventional manner.

The dielectric film provided on the III-V substrate can also include one or more layers. In one example of such a configuration, the GaAs substrate 18 is coated with a layer of silicon nitride of, e.g., about 20 nm in thickness and a layer of silicon dioxide of, e.g., about 350 nm in thickness. The nitride and oxide layers can be deposited by, e.g., conventional chemical vapor deposition (CVD), plasma enhanced chemical vapor deposition (PECVD) techniques, sputtering, or other technique. It can be preferable for many applications to densify the deposited oxide layer.

The invention contemplates a wide range of dielectric materials to be employed as films on the Si and III-V substrates. Any dielectric that can be bonded to another material can be employed. Deposition, spin application, thermal growth, and other suitable dielectric film formation processes can be employed. BSG, BPSG, TEOS, and other such glass-like films, as well as spin-on glass, and polymers, e.g., polyimide, can be employed.

For many applications, and particularly for high frequency optoelectronic circuit applications, it can be preferable to maintain electrical isolation between the Si and III-V substrates and such is enabled by the dielectric layers. It is recognized, however, that direct bonding of the Si and III-V substrates can be carried out without the inclusion of intermediate dielectric layers. It is also recognized that semiconducting or conducting intermediate layers can be employed, so long as adequate electrical device isolation is provided as-needed for a given application.

Preferably, the surfaces of the dielectric films are relatively smooth for facilitating bonding. If necessary, chemo-mechanical polishing (CMP) or a suitable etch process can be employed to remove any hillocks or other surface roughness that may exist on the surface of the films. In one example process, CMP is carried out on both the Si and the III-V dielectric films to remove about 50 nm to about 100 nm of material from the dielectric film surfaces. If the films are found to be sufficiently smooth, such a process is not required.

The two substrates are then cleaned, preferably employing cleaning processes that are suitable for the material composition of each substrate. For example, the Si substrate can be cleaned by a conventional RCA cleaning process and a GaAs substrate can be cleaned by a conventional de-ionized water clean. For many applications, it can be preferable to end the cleaning of both the Si and III-V substrates with a brief hydrofluoric acid etch to produce hydrophilic bonding surfaces. Alternatively, a dry process, e.g., an oxygen or hydrogen plasma process, can be employed to render the substrate surfaces hydrophilic.

Figure 1B:
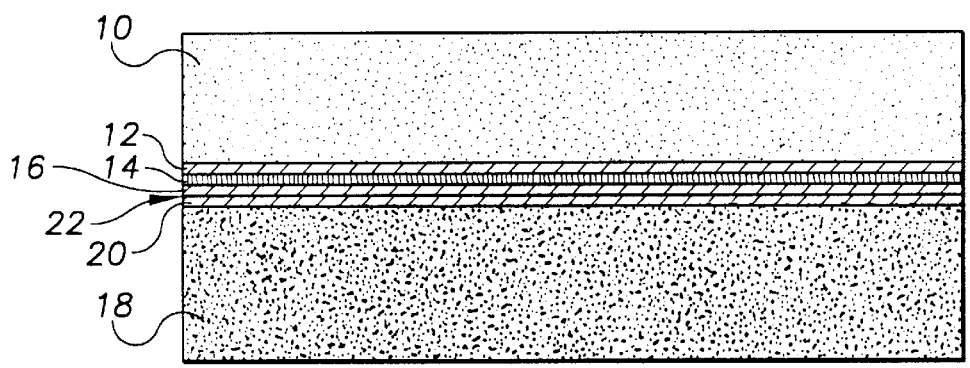

Referring to FIG. 1B, the two substrates 10, 18, are then brought into contact with the dielectric layers positioned between the substrates. The substrate contact is preferably made under pressure at room temperature to form a bond, e.g., a hydrophilic bond, between the substrates. Pressure can be applied to the substrates manually or through any suitable apparatus, e.g., a conventional wafer bonding apparatus. The pressure applied to the substrates preferably is below that pressure which could cause fracture of either of the substrates; for many applications, relatively light manual pressure is sufficient. An anodic or thermo-anodic bonding process can also here be employed.

At this point, a bond interface 22 is formed between the dielectric layers 16, 20 of the two substrates. If dielectric layers are not provided on the substrates, the substrate contacting process results in direct bonding between surfaces of the substrates, with the bond interface correspondingly formed directly between the substrates. Preferably, the contacting process results in bonding of a substantial lateral extent of the substrates. Accordingly, it can be preferred to employ interferometric diagnostic techniques to determine the lateral extent of bonding across the substrates, and to iteratively apply pressure as-needed to increase the lateral bond area.

In accordance with the invention, at this point, the composite substrate structure can be subjected to a heat treatment such as annealing at a relatively low temperature, if desired, but such is not necessarily required for all applications. It is found that for many applications, the room-temperature hydrophilic bond between the substrates is adequate for the next processing steps. The objective of a low-temperature anneal, if carried out, is to further form and to strengthen bonds between the substrates but not to induce thermal stress at a level that could cause the substrates to separate or cause one or both substrates to fracture.

Accordingly, a low-temperature anneal preferably is carried out at a temperature no higher than that which could be expected to induce substantial thermal stress in either of the substrates. For many applications, it is found that the low-temperature anneal preferably is carried out at a temperature above ambient but less than about 350° C. to minimize thermal stress in the bonded wafer pair. The anneal temperature is also preferably limited to a maintain integrity of the intermediate dielectric or other materials that are included on the substrates.

It is found that the completion of an initial low-temperature anneal cycle, additional low-temperature anneal cycles at temperatures higher than that of the first cycle can be carried out, if desired, to strengthen the substrate bond without inducing substantial thermal stress. In one example low-temperature anneal for Si-GaAs substrate bonding, a first anneal cycle is carried out at a temperature of about 150° C. for about 15 hours, followed by a second anneal cycle carried out at a temperature of about 250° C. for about 15 hours. It is found that there exists a direct correlation between bond strength and anneal temperature and time. Specifically, the lower the anneal temperature, the longer the time required for the anneal to achieve the same bond quality produced by an anneal carried out at a relatively shorter time but higher temperature. Based on this consideration, a multiple cycle anneal schedule can be devised to produce a desired bond strength, but the invention does not require the use of more than one anneal cycle.

For any selected anneal cycle schedule, it is preferred for each cycle that the anneal temperature be slowly ramped up at the start of the cycle and slowly ramped down at the conclusion of the cycle. The ramp rate preferably is slow enough to maintain isothermal substrate pair conditions, i.e., to enable the two substrates to reach increasing temperatures, or decreasing temperatures, substantially at the same time, whereby both substrates are at substantially the same temperature at the start of the anneal cycle. It is also preferred that each anneal step or cycle be carried out in an inert atmosphere, e.g., in a nitrogen gas flow.

After the initial substrate bonding steps, the silicon substrate is thinned. In accordance with the invention, the silicon substrate is thinned to a thickness that is less than a characteristic thickness below which the substrate will elastically deform, rather than fracture, in response to thermally-induced stress resulting from disparity in the thermal expansion coefficients of the two substrates. Once the silicon substrate is thinned based on this criterion, the composite structure can be exposed to a high-temperature anneal process for fusing the bonded substrates together, if desired. In one example process, the III-V material substrate is maintained at a thickness suitable for standard microfabrication processing and the silicon substrate is thinned to a point that enables elastic deformation, rather than fracturing, of the substrate. If desired, the III-V material substrate can also be thinned. If both substrates are to be thinned, then the resulting composite structure preferably is of a thickness sufficient to maintain structural integrity and to accommodate handling by conventional microfabrication equipment.

It is recognized in accordance with the invention that optoelectronic devices are intrinsically relatively thick devices, e.g., greater than about 1 $\mu$m in thickness, and are very sensitive to stress induced in the substrate on which they are fabricated. Conversely, silicon electronics typically are fabricated within the top tens of nanometers of a silicon substrate surface, and are relatively insensitive to materials stress. It is therefore preferred in accordance with invention to retain a relatively thick III-V substrate and to thin the Si substrate. This enables the fabrication of thick, strain-sensitive and defect-sensitive optoelectronic devices on the optimum substrate for such, namely, a thick Ill-V material substrate, and enables the fabrication of Si electronic devices in a thin Si layer that is sufficient for such fabrication but which has been thinned to eliminate thermally-induced stress in both the Si and III-V materials. As a result, Si electronics, e.g., CMOS electronics, can be monolithically integrated with high-performance III-V material optoelectronic devices such as laser diodes and photodetectors as well as III-V material electronic devices such as MESFET and HEMT devices in a configuration that is mechanically robust to thermal processing. It is therefore preferred that the III-V material substrate thickness be maintained to provide the physical strength of the composite substrate structure, with the silicon substrate being thinned to minimize stress in the composite structure.

Preferably, the III-V substrate is maintained at a thickness that can be exploited to employ it as a handle wafer for cleaning and conventional microfabrication processing steps. A III-V substrate thickness of, e.g., at least about 200 $\mu$m is suitable for many applications. The silicon substrate is preferably thinned to that thickness which meets the elastic deformation criteria discussed above, as well as criteria for the silicon devices to be fabricated. A silicon layer of less than about 1 $\mu$m in thickness is preferred, and a silicon layer of less than about 5000 Å in thickness can be preferred for many applications. Still further, a silicon layer of less than about 2000 Å can be preferred for many applications.

Figure 1C:
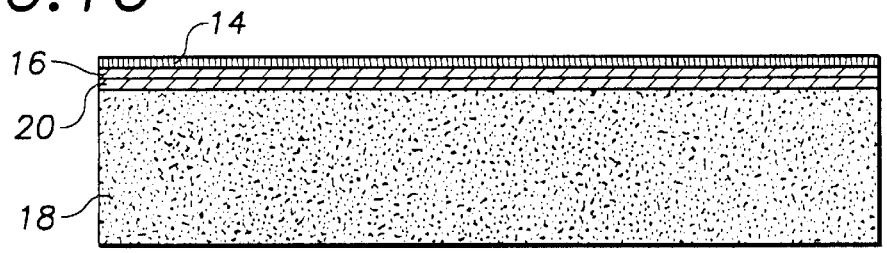
Figure 1D:
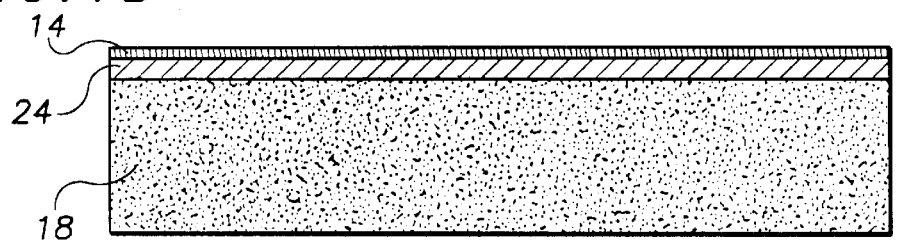

Referring to FIGS. 1B–1C and as explained above, there can be provided an etch stop layer to facilitate thinning of the silicon substrate. In the example of FIG. 1C, the silicon substrate 10 has been thinned by suitable technique down to the buried oxide layer 12 which itself has then been removed to expose the top silicon layer 14 of a thickness of, e.g., about 75 nm. The invention contemplates a wide range of substrate thinning processes and is not limited to a particular thinning technique. For example, where the Si substrate is provided as a SIMOX wafer, a substantial portion of the lower bulk of the wafer can be removed by a suitable wet etch, e.g., a solution of nitric, acetic, and hydrofluoric acids. Other wet etch chemistries, as well as dry etch processes, can be employed for removing the lower bulk of the substrate.

For many applications, it can be preferable to remove the remaining bulk portion down to the buried oxide layer by a more selective, controllable etch, e.g., employing a wet etch chemistry such as a solution of tetramethylammonium hydroxide (TMAH) at a temperature of about 70° C. It is preferable to employ an etch temperature that is below the TMAMH flash point. Other selective wet etch chemistries, e.g., potassium hydroxide (KOH), or any other well-controlled etchant, can be employed here. A dry etch can also be employed to remove the remaining substrate bulk down to the buried etch stop layer. The buried etch stop layer is then removed by a suitable process, e.g., a wet hydrofluoric acid etch, a plasma etch, or other suitable process, for exposing the thin silicon layer 14 as shown in FIG. 1C.

The invention does not require a bulk etch process that is controlled to end on an etch stop layer. Alternatively, a well-controlled wet or dry etch can be employed to thin down a bulk substrate to a prespecified desired thickness. Mechanical material removal processes, such as grinding, milling, or lapping, CMP, or other suitable process, can also be employed to thin a substrate to a selected thickness.

The invention contemplates alternative methods for thinning a substrate. In one particularly efficient process, a heavy dose of hydrogen atoms is implanted in the silicon substrate at a depth that defines a thin silicon region above the implanted layer. The silicon substrate is then bonded to the III-V substrate and annealed in the manner described above. During the anneal step, the silicon substrate is weakened along a plane that is coincident with the peak of the implanted hydrogen profile. This mechanical weakness causes the substrate to fracture along the plane, whereby the thin silicon layer is cleanly split from the substrate and remains bonded to the III-V substrate.

CMP or other polishing techniques can then be employed to smooth the surface of the thin silicon layer. Various combinations of implant species, e.g., hydrogen and boron, or other combinations, can be employed to tailor the anneal temperature at which the thin silicon layer fractures from its substrate. It is recognized that other processes for inducing substrate fracture at a plane of mechanical weakness can be employed to thin a substrate. For example, mechanical force, supplied by, e.g., a jet stream, and directed at the desired fracture plane, can be employed.

Once at least the silicon substrate is thinned, the composite structure can then be subjected to a high-temperature anneal step if such is desired for a given application. Referring to FIG. iD, this high-temperature anneal step is carried out to more fully fuse together the substrate dielectric layers, if such were included, to produce a more fully fused dielectric region 24. If dielectric layers were not included on the substrates, then the high-temperature anneal step produces a fused substrate region. In either scenario, the composite fused substrate structure produced by the high-temperature anneal step is rendered more mechanically robust for withstanding conventional high-temperature thermal cycles employed in microfabrication of devices on the composite. It is recognized in accordance with the invention that for many applications, a high-temperature anneal step may not be required.

Preferably, the high-temperature anneal step is carried out at a temperature that is greater than that of the low-temperature anneal step, if such was carried out. A temperature greater than about 200° C. can be preferred for the high-temperature anneal step, and for many applications, a temperature greater than about 350° C. can be preferred for the high-temperature anneal step. For many applications, a temperature that is at least as high as the highest temperature at which later processing steps will be carried out can be preferred for the high-temperature anneal step. This enables strengthening of the substrate bond to ensure a minimum degree of robust bond integrity at the start of the process, thereby minimizing the likelihood of substrate fracture or warpage during the processing.

It is recognized that further considerations must be made as to the impact of a selected high-temperature anneal temperature on the characteristics of the substrate materials employed. For example, in the case of a GaAs substrate, arsenic can desorb from the substrate above a temperature of about 600° C. It is therefore preferred in accordance with the invention that for anneal temperatures higher than about 600° C., the GaAs substrate be provided with an encapsulation layer, e.g., a silicon nitride layer, or an arsenic overpressure be maintained during the anneal. If an arsenic overpressure is provided, an encapsulation layer is not needed. Similar considerations are preferably made for other III-V materials, such as indium phosphide, which can degenerate at temperatures even below 600° C.

Figure 1E:
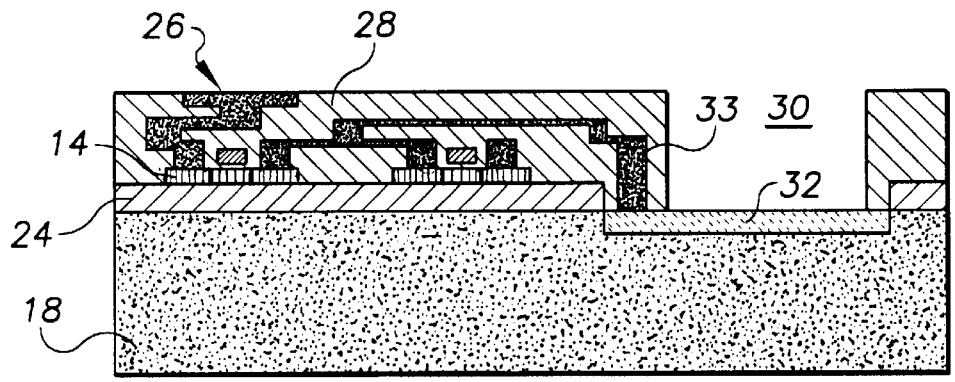

Referring to FIG. 1E, with the fully bonded Si/III-V composite substrate structure complete, electronics and/or optoelectronics can be monolithically fabricated on the two substrate materials. For example, as shown in the figure, the silicon layer 14 can be employed to fabricate circuitry and interconnections 26, such as CMOS circuitry including multi-layer interconnection configurations. Interlayer dielectric and circuitry capping layers 28, e.g., BPSG, silicon dioxide, or a suitable glass, can then be provided in the conventional manner on the fabricated electronics.

Integrated fabrication of electronic and/or optoelectronic devices on the III-V substrate material can also be carried out. In one example process for producing optical devices, a window 30 in the CMOS capping layer 28 or other layers coating the III-V substrate is opened to expose the III-V substrate surface for fabricating devices on the surface. For example, where employing a GaAs substrate, the GaAs region exposed in the window 30 can be implanted with a suitable dopant, e.g., an $n^+$ dopant, to produce a backside contact region 32 to, e.g., a GaAs light emitting diode (LED) to be formed on the substrate. For many applications, it can be preferable for the silicon circuitry interconnection configuration to include an interconnection 33 to the backside contact region 32, but such is not required by the invention.

Figure 1F:
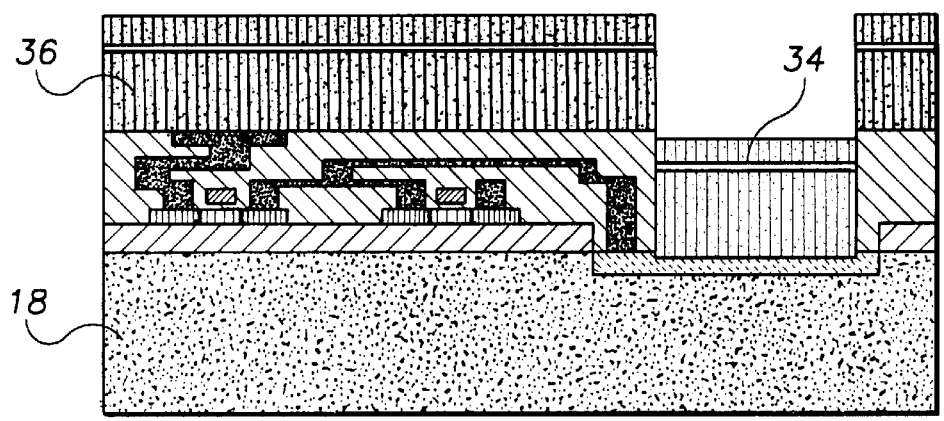

As shown in FIG. 1F, for the example of fabrication of a GaAs LED, an epitaxial LED heterostructure 34 is then grown on the exposed GaAs substrate region, including, e.g., AlGaAs, and InGaAs. This growth produces a polycrystalline layer deposition 36 on silicon layer, e.g., over the silicon circuitry, and can be removed by conventional processes such as CMP or lithography and wet or dry etching.

It is to be recognized in accordance with the invention that the III-V substrate region exposed by the window 30 in FIG. 1E can be exploited for fabricating III-V electronic devices and circuitry as well as optical devices. For example, GaAs transistor configurations can be fabricated in conjunction with optical device fabrication. This enables the integration of both III-V electrical and optical devices with the silicon devices and circuitry. As explained just above, for many applications, it can be preferable for the silicon circuitry interconnection configuration to include an interconnection to the III-V electronic devices, e.g., in the manner described in detail below.

Figure 1G:
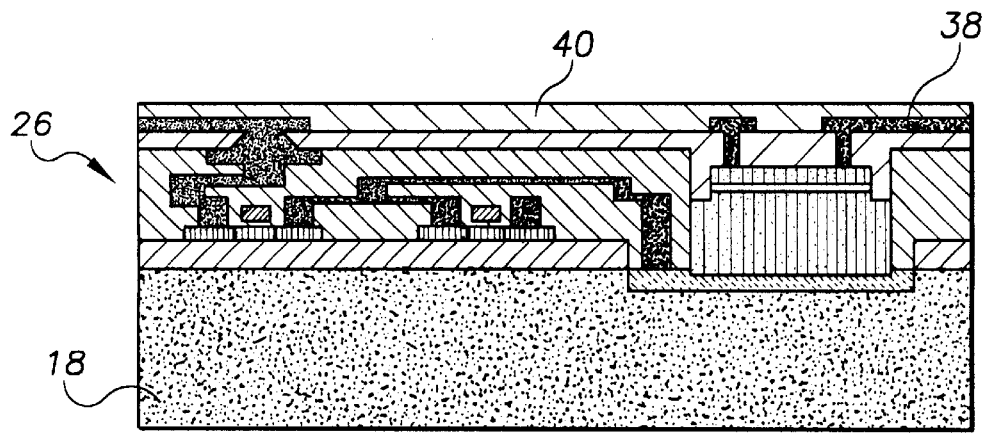

In a next step, as shown in FIG. 1G, electrical contacts 38 are then formed for connecting to the optical devices 34 and any III-V electronic devices, and for connecting to the silicon electronics 26. A final capping layer 40, e.g., an overglass layer, can then be provided, if desired, to cap the completed dual-substrate configuration if such is required for a given application. A fully integrated system of silicon electronics and III-V material optoelectronics is thus produced.

It is recognized in accordance with the invention that for some applications and for some microfabrication process environments, it is undesirable to carry out silicon circuit microfabrication on a composite Si/III-V substrate structure. Materials handling and contamination concerns can overshadow efficiency gains for some substrate combinations; for example, it can be undesirable to expose silicon microfabrication equipment to a GaAs substrate. As a result, the substrate bonding processes of the invention described above may not be optimal for a given process sequences or process environment.

Figure 2A:
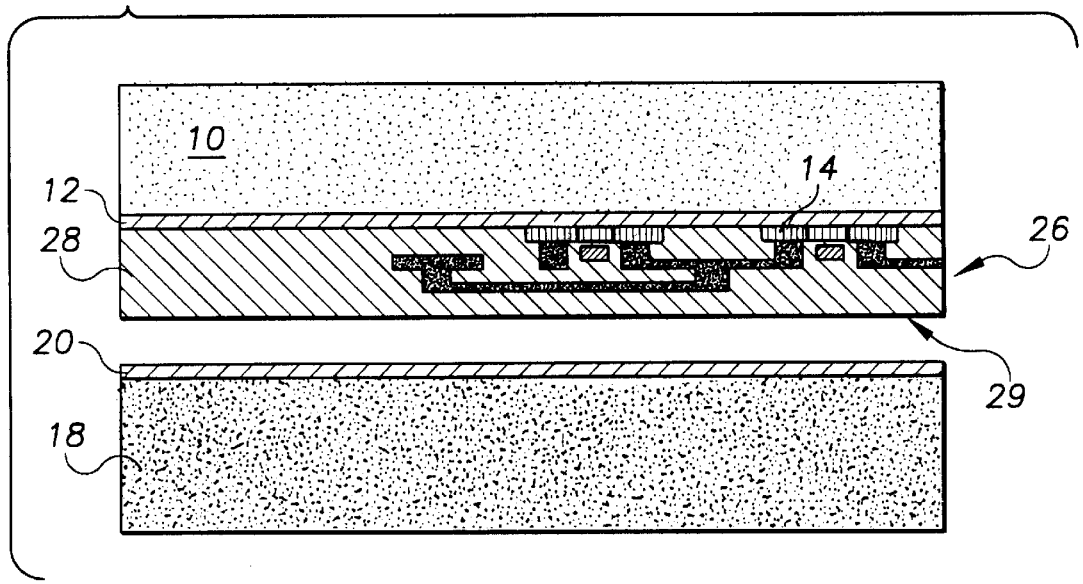
FIGS. 2A–2F are schematic cross-sectional views of a silicon substrate and a III-V material substrate at various stages of a second example process provided by the invention for bonding the silicon substrate and the III-V material substrate, with silicon electronic devices fabricated before the bonding and III-V material optical devices fabricated after the bonding, in accordance with the invention.

The invention provides an alternative substrate bonding process to address applications where, for example, a Si microfabrication process environment cannot accommodate a Si/III-V composite substrate structure. Referring to FIG. 2A, in this alternative bonding process, there is provided a silicon substrate 10 including, if desired, an etch stop layer 14. Silicon microelectronics and electrical interconnections 26, e.g., CMOS electronics with full interconnect metallization, are fabricated in the conventional manner on a top layer 14 of the substrate 10. This configuration can be produced by, e.g., microfabrication of the electronics on the top layer of a conventional SOI wafer, employing standard Si microfabrication process equipment. A capping layer 28 of, e.g., oxide or glass, is formed over the fabricated electronics 26 and interconnect configuration.

In the manner described previously, a III-V material substrate 18, e.g., a GaAs substrate, is provided, including a dielectric film 20, which can optionally consist of multiple layers, e.g., silicon nitride and silicon dioxide layers, if desired. The surface of the bonding film 20 of the III-V substrate and the top surface 29 of the Si substrate capping layer 28 are preferably smoothed by, e.g., a CMP process or other suitable technique for producing relatively highly planar bonding surfaces.

Figure 2B:
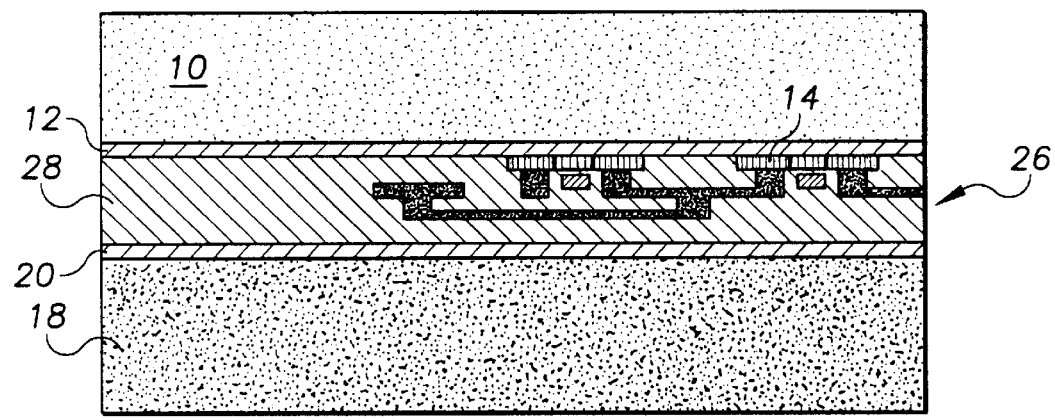

Referring to FIG. 2B, the dielectric film 20 of the III-V substrate is then brought into contact with the capping layer material 28 of the Si substrate, in the manner previously described, to produce an initial hydrophilic bond between the two substrates. A low-temperature anneal step can further be carried out at this point if desired, in the manner described above. It is preferred that the temperature of the low-temperature anneal step be held below that which could degenerate materials provided on the substrates. For example, the anneal temperature is to be below that which would degrade aluminum or copper interconnections provided on the silicon substrate.

Figure 2C:
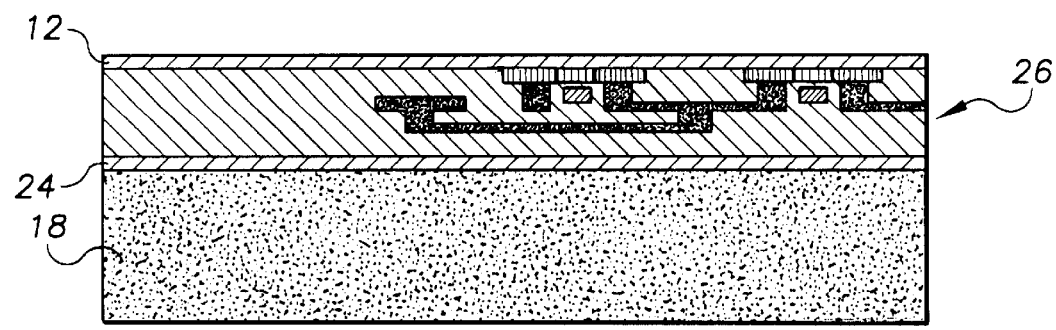

Next, referring to FIG. 2C, the Si substrate is thinned as described above to expose the etch stop layer 12, if such was included, or otherwise to thin the Si substrate to a thickness at which thermally-induced fracture of the composite substrate structure is inhibited.

At this point, a high-temperature anneal step can be carried out if desired to produce a more robust fused region 24 between the III-V substrate dielectric film and the Si substrate capping layer 28. The temperature of the high-temperature anneal step preferably is held below that which would cause degeneration of materials provided in conjunction with the Si electronics and is carried out in the manner described above.

Figure 2D:
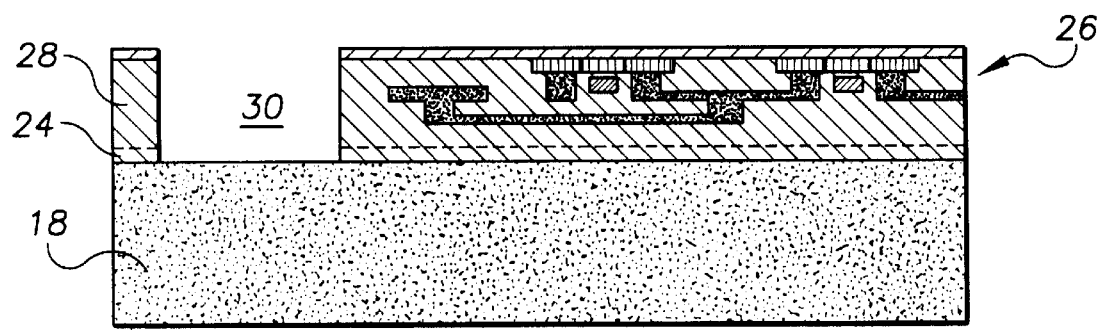
Figure 2E:
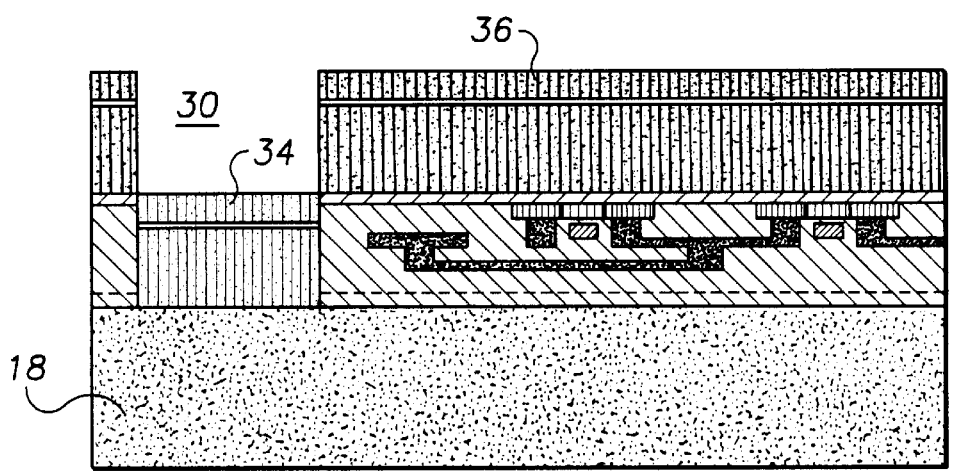

With the annealing step or steps completed, the composite substrate structure can be further processed to produce electronics and/or optoelectronics on the III-V material substrate. Referring to FIG. 2D, in one example process, a window 30 is opened in the overlayer 28 and bonded region 24 to expose the III-V material substrate. Then, as shown in FIG. 2E, single crystal heteroepitaxial layers 34 can then be grown in the exposed III-V substrate region to produce, e.g., an LED structure. This growth typically results in deposition of a polycrystalline material 36 on the Si layer, and can be removed by conventional etch processes or chemomechanical polishing processes.

Figure 2F:
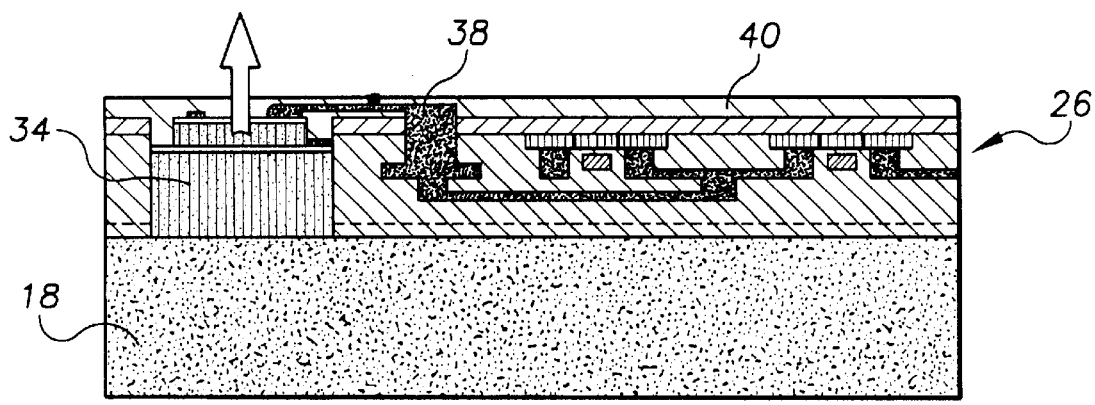

Referring to FIG. 2F, electrical interconnections 38 can then be fabricated for connecting to the optical devices and the electronic circuitry. As shown, it is preferable that the Si circuitry interconnections produced prior to bonding be configured to accommodate interconnection vias to the optical device interconnections. A dielectric overcoating layer 40 can then be provided over the interconnections if such is desired for a given application. A fully functional system including Si electronics and III-V material electronics and/or optoelectronics is thus produced.

Figure 3A:
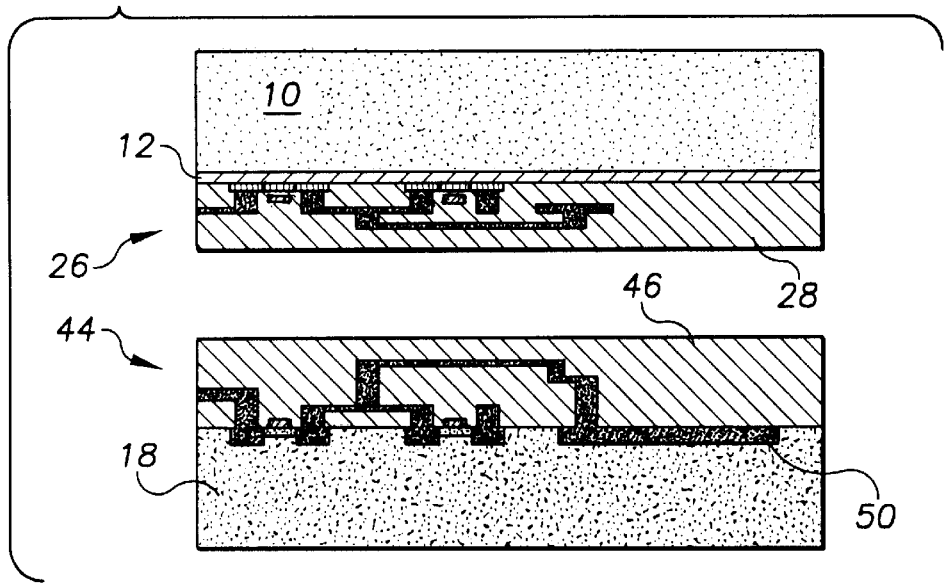
FIGS. 3A–3B are schematic cross-sectional views of a silicon substrate and a III-V material substrate at two stages of a third example process provided by the invention for bonding the silicon substrate and the III-V material substrate, with silicon electronic devices and III-V material electronic devices fabricated before the bonding, and III-V material optical devices fabricated after the bonding, in accordance with the invention.

In accordance with the invention, this process can be extended to the bonding of III-V substrates and Si substrates that both include pre-fabricated electronics. Referring to FIG. 3A, in one example of this configuration, a Si substrate 10 is provided, including an etch stop layer 12, if such is desired, and including circuitry and interconnections 26.

Similarly, a III-V substrate 18 is provided, including electronic devices and circuitry, and further including optical devices, if desired, along with interconnections 44. Preferably, an interconnection configuration 50 is provided from electronic and optical devices to the location of any optical devices to be fabricated on the substrate at a later processing step. Interconnection configurations other than the example configuration shown can further be included. The III-V material electronics can include, e.g., MESFET, HEMT, HBT-based micro- and millimeter wave integrated circuits, and other III-V circuitry, including digital circuitry. Various III-V material optics can further be included. The III-V substrate can include an etch stop layer for thinning of that substrate in the manner described above.

A dielectric overcoat layer 28 is provided on the silicon electronics, and similarly, a dielectric overcoat layer 46 is provided on the III-V electronics. These overlayers 28, 46 are preferably smoothed by a suitable process to provide substantially planar surfaces for bonding. Additional dielectric or other layers can be formed on and in the overcoat layers as-desired for a given application. For example, electrical interconnect vias and conductors in the vias can be produced prior to bonding of the substrates to provide interconnection between Si and III-V electronic devices and circuitry.

Figure 3B:
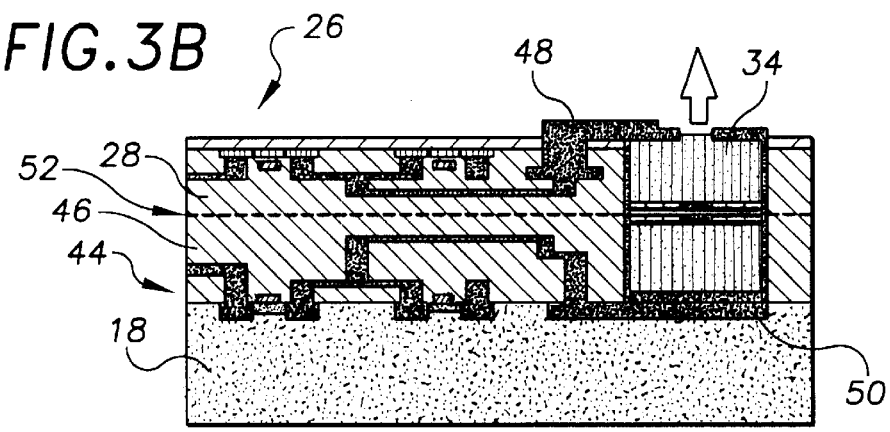

Referring to FIG. 3B, the Si and III-V substrate overlayers 28, 46 are bonded together and fused at a bonding region 52, following the bonding processes described above, to produce a Si/III-V composite substrate structure. Then at least the Si substrate is thinned to a thickness that enables the composite substrate structure to withstand thermally-induced stresses during further processing.

It is preferred in accordance with the invention that where a substrate to be thinned includes fabricated electronics or other structures, the thinning process accommodate the electronics. For example, it can be undesirable to implant a buried fracture plane layer after electronics are produced in a silicon substrate, but such a layer cannot in general be produced prior to the fabrication. As a result, device structures and metal interconnect configurations could locally distort the implanted profile and prevent formation of an adequate substrate fracture plane. Accordingly, a substrate fracture process may not be preferred for substrates including electronics.

Other steps of the bonding process similarly are to be considered for their impact on fabricated electronics. For example, plasma-assisted techniques for rendering dielectric films hydrophilic, in preparation for bonding, can produce an electrostatic discharge that could damage electronics. If such is a concern for a particular substrate material or circuit configuration, then plasma exposure of the substrates is preferably avoided.

Once at least the Si substrates is thinned, the composite substrate structure can then be exposed to a high-temperature anneal step in the manner described above, if such is desired. Thereafter, optical devices 34 can be produced on the III-V substrate, but such is not required by the invention. The monolithic integration of Si electronics with III-V material electronics alone, without the inclusion of III-V optical devices, is contemplated by the invention for addressing a wide range of applications.

Figure 3C:
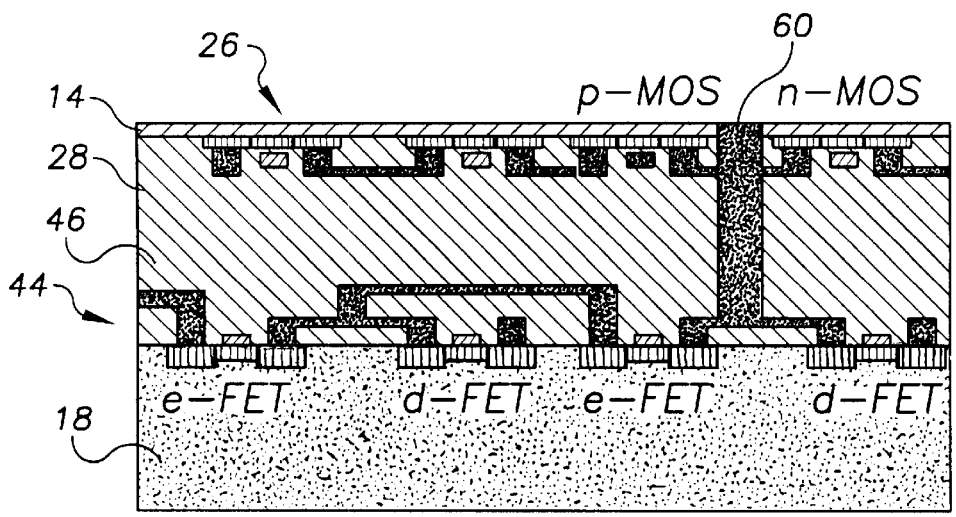
FIG. 3C is a schematic cross-sectional view of a silicon substrate bonded to a III-V material substrate by a process provided in accordance with the invention, wherein silicon electronic devices and III-V material electronic devices are fabricated before the bonding and an electrical interconnection if formed between the silicon and III-V material devices.

Referring to FIG. 3C, in one electronics integration example, Si circuitry 26, including, e.g., p-MOS and n-MOS electronics control, digital signal processing, and/or memory circuits are fabricated in conjunction with GaAs, InP, or other III-V material high-speed transistor or other circuitry configurations 44, e.g., GaAs enhancement FETs and depletion FETs. The Si circuitry is provided on a thin silicon layer 14 resulting from the thinning of a Si substrate, while the III-V circuitry is provided on a III-V substrate 18 that is maintained at a substantial thickness. The two materials are bonded at an interface between the protective layers 28, 46, of the circuitry. As shown in the figure, an interlevel interconnect via 60 can be provided between the Si layer and the III-V substrate. Such can be formed after the two materials are bonded together, to enable electrical connection between the silicon and III-V electronics.

This integration of Si and III-V electronics addresses the current difficulty in producing large, high-density III-V material memory arrays and high-performance microprocessors. The invention thereby enables the synergistic exploitation of advantages of the two circuit materials to enable electronic systems having intelligent control and memory along with very high speed. Such can be particularly important for addressing optical communications applications, e.g., in wavelength division multiplexing and channel drop filter systems.

Based on the discussion above of the various bonding processes provided by the invention, it is to be recognized that for many applications, the III-V substrate can be thinned in addition to the Si substrate. As discussed above, it is preferred that the composite substrate structure be sufficiently robust to withstand fabrication sequences intended for the structure. But if fabrication is to be entirely completed prior to bonding of the substrates, then such is not required.

The example bonding processes described above indicate a few of the wide range of electronics and optoelectronics microfabrication sequences contemplated by the invention. Electronics and/or optoelectronics can be fabricated on one or both of the substrates prior to or after a substrate bonding step. The invention is not limited to the III-V LED illustrated in the examples of the description above. III-V material lasers, photodetectors, and other optical components can be fabricated in the III-V material. The LED structure in the example was included for illustrative clarity. Similarly, the invention is not limited to the example electronics and other circuitry illustrated above; such was provided as an example only.

The bonding process itself is preferably adjusted to accommodate electronics previously fabricated on either of the substrates. Similarly, thinning of one or both of the substrates is to be carried out in a manner that accommodates electronics and related materials and that results in a structure that is sufficiently robust to withstand further fabrication steps, if such are to be carried out.

III-V materials including InAs, InP, GaAl, GaN, SiC, GaSb, and other III-V materials can be employed in accordance with the invention. It is not required that the materials be available as conventional microfabrication wafers; the invention contemplates substrates of various shapes and sizes, including fractions of wafers.

EXAMPLE 1

A GaAs wafer having a diameter of about 4 inches and a thickness of about 670 μm was prepared for bonding with a 4 inch diameter, 550 μm thick SIMOX wafer having a 370 nm-thick buried oxide layer and a 200 nm-thick silicon top layer. A 20 nm-thick layer of silicon nitride and a 350 nm-thick layer of silicon dioxide were deposited by PECVD on the wafer and densified at a temperature of about 700° C. for about 30 minutes. A 150 nm-thick thermal oxide was grown on the SIMOX wafer top surface, reducing the Si layer thickness to about 130 nm. A BPSG layer of about 500 nm in thickness was then deposited on the oxide layer at a temperature of about 400° C., and densified at a temperature of about 925° C.

The top surface of both wafers was then polished by CMP; this process removed between about 50 nm to about 100 nm of material. After cleaning and HF etching, the front surfaces of the two wafers were brought into contact under manual pressure at room temperature to form a hydrophilic bond between the surfaces. At this point, viewing of the wafer pair in transmission using monochromatic infrared illumination confirmed that the two wafers were in intimate contact.

The wafer pair was then annealed at a temperature of about 150° C. for about 13 hours, immediately followed by an anneal at a temperature of about 250° C. for about 15 hours. At the start of the first anneal step, the temperature was slowly ramped up over the course of about 0.5 hours; similarly, at the end of the second anneal step, the temperature was slowly ramped down over the course of about 0.5 hours. The anneals were carried out under conditions of nitrogen gas flow.

The substrate of the SIMOX wafer was then removed by a two-step etching process. A solution of nitric, acetic, and hydrofluoric acids was employed in a jet etching apparatus to remove the substrate bulk down to a point where about 50 μm of bulk remained below the buried oxide layer. A wet etch of tetramethylammonium hydroxide at a temperature of about 70° C. was then employed to remove the remaining substrate bulk material below the buried oxide layer. With the bulk Si removed, the wafer pair was of a thickness of about 1.3 μm.

Figure 4:
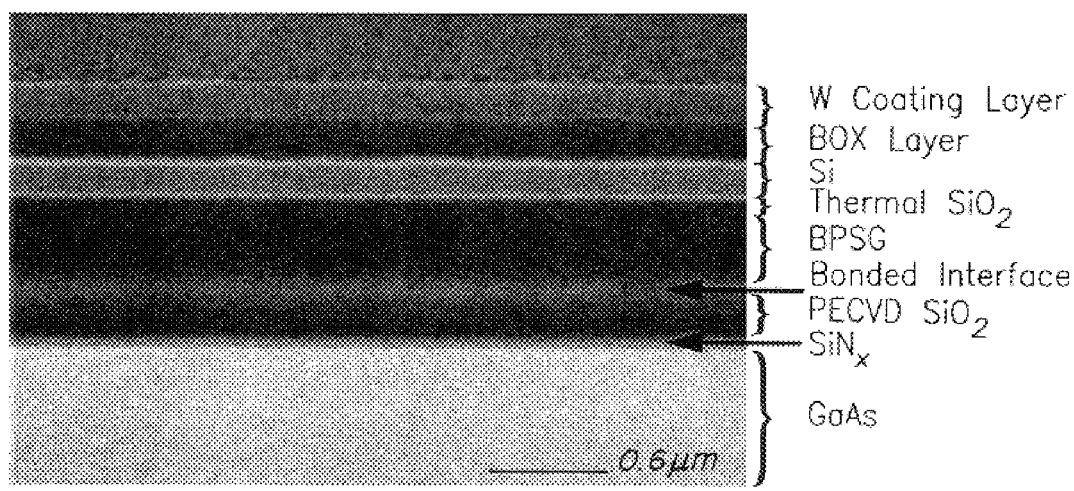
FIG. 4 is a cross-sectional transmission electron micrograph (TEM) of a silicon layer bonded to a GaAs substrate as-produced by a bonding process provided by the invention.

FIG. 4 is a cross-sectional scanning electron micrograph (SEM) of the wafer pair etched by a focused ion beam, taken at a 60° viewing angle. As seen in the SEM, a thin tungsten layer was coated on the exposed SIMOX oxide layer to better delineate the top edge after etching. This layer, as well as the 130 nm-thick silicon layer, the various dielectric layers, and the GaAs substrate, are all clearly visible. The location of the interface between the BPSG layer on the SIMOX wafer and the PECVD oxide layer on the GaAs wafer is indicated by a white band thought to arise from difference in the two glasses and some possible interdiffusion; the bonded interface is not itself visible.

Figure 5A:
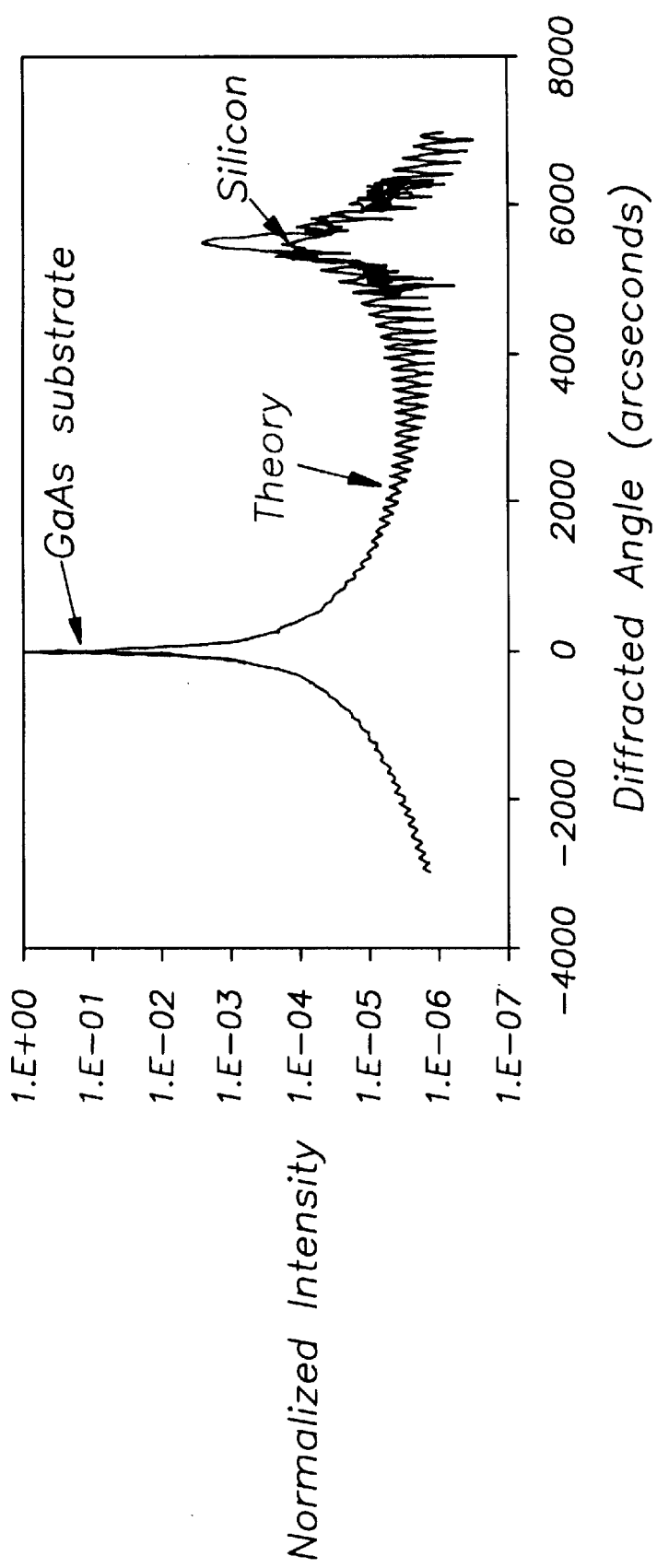
FIGS. 5A and 5B are wide scan and narrow scan X-ray rocking curves, respectively, measured for the bonded silicon GaAs substrates of the TEM of FIG. 4.
Figure 5B:
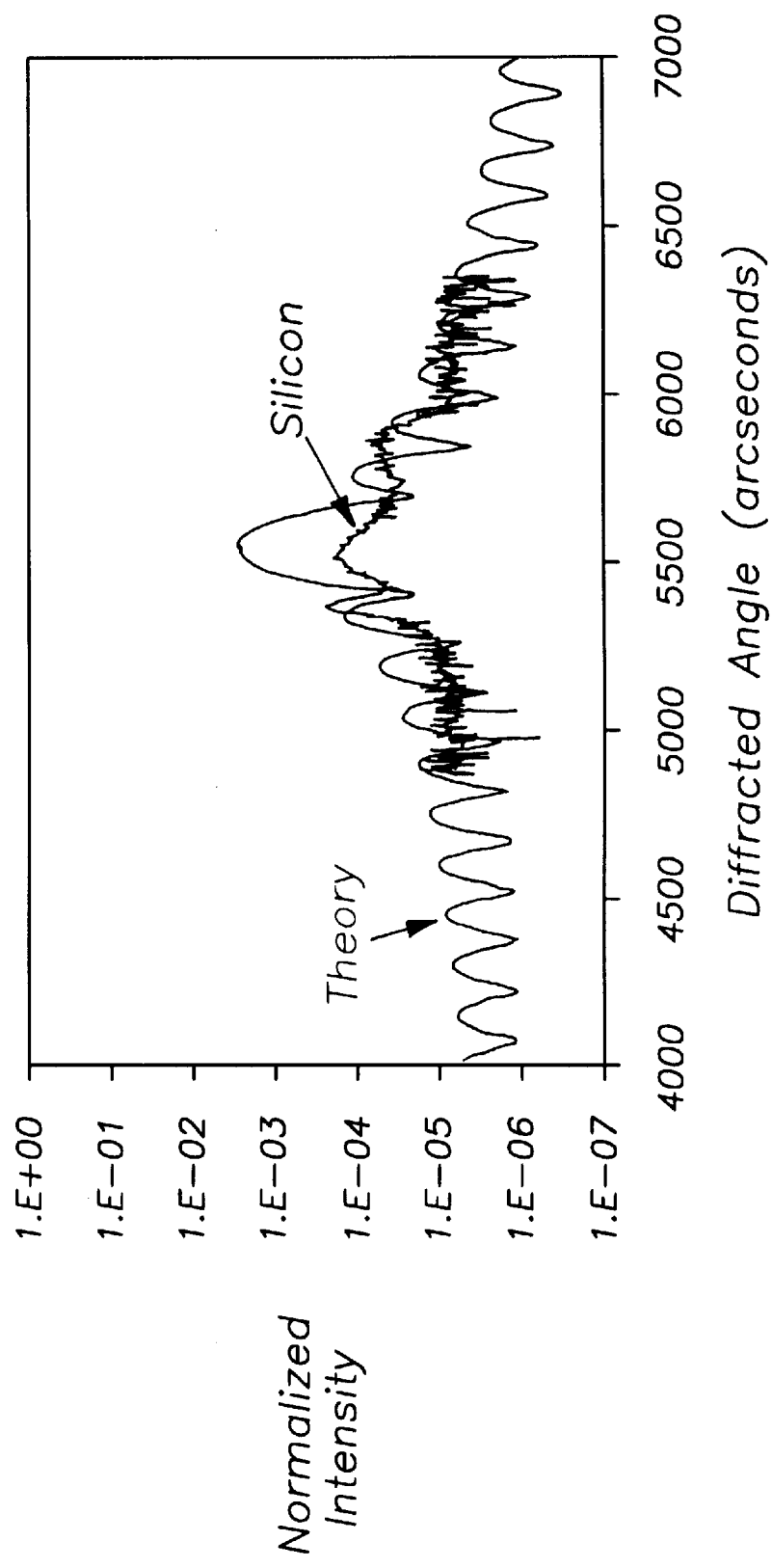

FIGS. 5A and 5B are wide scan and narrow scan X-ray rocking curves, respectively, taken for the wafer pair. The wide scan in FIG. 5A indicates that the GaAs substrate is unstrained and that there is a silicon peak at the expected position. Closer examination of the silicon peak in the scan of FIG. 5B highlights that the highest measured peak is to the left of the relaxed peak position, i.e., the peak in the theoretical curve, indicating that the silicon layer is under slight compression, on the order of about 0.06%. This slight compression is to be expected from cooling the wafer pair after the anneal processes.

The wafer pair was then cut into several pieces and subjected to a high-temperature anneal step. Here the composite wafer pieces were annealed in a nitrogen atmosphere at a temperature of about 700° C. for about 30 minutes. The temperature was ramped up to and down from the 700° C. anneal temperature over the course of a couple of hours. No fracture or separation of the bonded layers occurred during the anneal.

EXAMPLE 2

Square samples of about 1 cm by 1 cm were produced from the fabricated wafer pair described in Example 1. Photoresist was spun on the exposed oxide surface of the SIMOX wafer and using conventional contact optical lithography, an array of 50 μm squares was patterned. Reactive ion etching (RIE) was then employed to etch the BOX and Si layers exposed by the pattern. The RIE conditions employed were 50 sccm $CF_4$ and 5 sccm $O_2$, at a pressure of about 30 Mt, 400 W of power, and a dc bias of about 487 V. This etch exposed the silicon dioxide layers of the SIMOX and GaAs wafers under the Si layer. These dielectric layers were removed with a buffered oxide etch, to expose the underlying GaAs substrate in the window pattern. The photoresist was then stripped with acetone.

Molecular beam epitaxy (MBE) was employed at a temperature of about 475° C. to grow a GaAs buffer layer and a $In_{0.2}Ga_{0.8}As/GaAs$ quantum well structure on the exposed GaAs substrate surface. The GaAs buffer layer was about 1.2 μm in thickness. Five $In_{0.2}Ga_{0.8}As$ quantum wells were grown with nominal thicknesses of 4 nm, 6 nm, 8 nm, 10 nm, and 20 nm. The GaAs spacer layers between the quantum wells were nominally about 20 nm in thickness. A GaAs cap layer of about 100 nm in thickness was produced. Prior to the MBE growth, native oxide on the GaAs substrate surface was removed by exposure to atomic hydrogen at a temperature of about 450° C.

Figure 6:
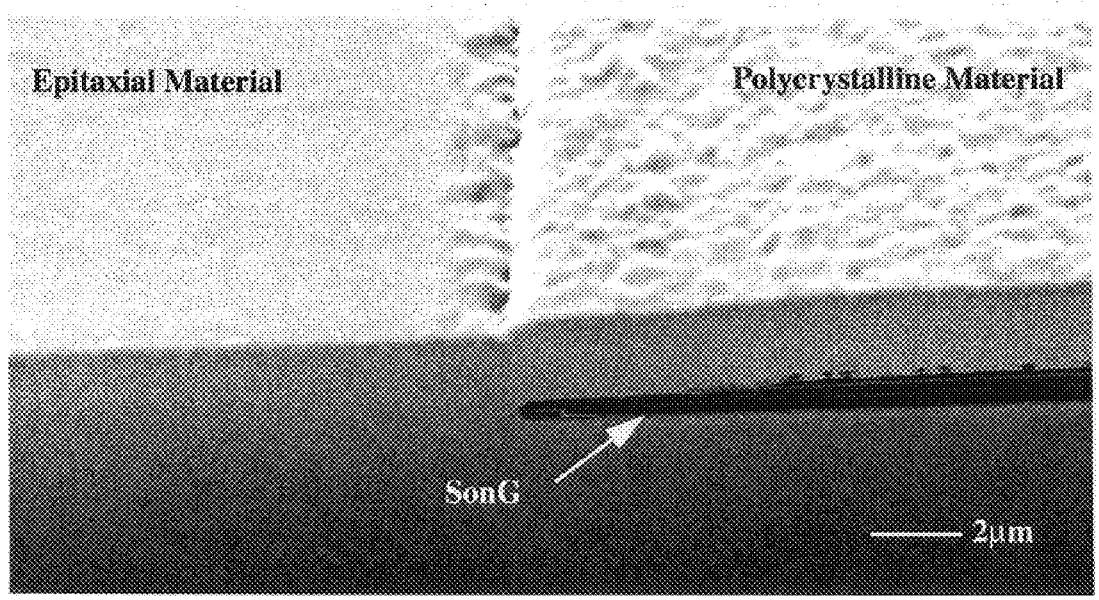
FIG. 6 is a cross-sectional TEM of a III-V heteroepitaxial layer grown on an exposed region of a GaAs substrate and a silicon layer bonded to the GaAs substrate as-produced by a bonding process provided by the invention.

FIG. 6 is a cross-sectional SEM photomicrograph of the resulting structure, produced in cross section by a focused ion beam etch cutting through the growth in one window (on the left) and the area adjacent to the window (on the right). The material grown on the exposed GaAs substrate was found to be single crystalline. Over the SIMOX BOX layer, the grown material was polycrystalline.

These examples demonstrate a few of the advantages of the bonding processes provided by the invention, particularly where a relatively thick III-V substrate is maintained and the Si substrate is thinned. As explained above, this enables the fabrication of thick, strain-sensitive and defect-sensitive optoelectronic devices on the optimum substrate for such, namely, a thick III-V material substrate, while enabling the fabrication of Si electronic devices in a thin Si layer that is sufficient for such fabrication but which has been thinned to eliminate thermally-induced stress in both the Si and III-V materials. The III-V material substrate thickness provides the physical strength of the composite substrate structure, while the thinned silicon substrate minimizes stress in the composite structure. As a result, Si electronics, e.g., CMOS electronics, can be monolithically integrated with high-performance III-V material optoelectronic devices such as laser diodes and photodetectors as well as III-V material electronic devices such as MESFET and HEMT devices in a configuration that is mechanically robust to thermal processing.

It is recognized, of course, that those skilled in the art may make various modifications and additions to the processes of the invention without departing from the spirit and scope of the present contribution to the art. Accordingly, it is to be understood that the protection sought to be afforded hereby should be deemed to extend to the subject matter of the claims and all equivalents thereof fairly within the scope of the invention.

We claim:

1. A method for bonding a silicon substrate to a III-V material substrate, comprising the steps of:
   contacting the silicon substrate together with the III-V material substrate;
   annealing the contacted substrates at a first temperature above ambient temperature; and
   thinning only the silicon substrate.

2. The method of claim 1 wherein annealing of the contacted substrates is carried out at a first temperature of between about 150° C. and about 350° C.

3. The method of claim 1 further comprising a last step of fabricating silicon electronic devices on the thinned silicon substrate.

4. The method of claim 3 further comprising a step of fabricating III-V electronic devices on the III-V material substrate after thinning of the silicon substrate.

5. The method of claim 3 further comprising a step of fabricating III-V material optical devices on the III-V material substrate after thinning of the silicon substrate.

6. The method of claim 5 wherein the step of fabricating III-V material optical devices comprises growing a heteroepitaxial layer on the III-V material substrate.

7. The method of claim 1 further comprising a step of fabricating silicon electronic devices on the silicon substrate before contacting the silicon substrate together with the III-V material substrate.

8. The method of claim 7 further comprising a step of fabricating III-V material electronic devices on the III-V material substrate before contacting the III-V material substrate together with the silicon substrate.

9. The method of claim 7 further comprising a step of fabricating III-V material optical devices on the III-V material substrate before contacting the III-V material substrate together with the silicon substrate.

10. The method of either of claims 4 or 8 further comprising a step of fabricating an electrical interconnection between silicon and III-V material electronic devices.

11. The method of claim 1 further comprising a first step of forming a dielectric layer on at least one of a silicon substrate surface and a III-V material substrate surface to be contacted together.

12. The method of claim 11 wherein forming a dielectric layer on at least one of a silicon substrate surface and a III-V material substrate surface to be contacted together comprises forming a dielectric layer on each of the silicon substrate surface and the III-V material substrate surface to be contacted together.

13. The method of claim 10 wherein the dielectric layer comprises an oxide layer.

14. The method of claim 11 wherein the dielectric layer comprises a nitride layer.

15. The method of claim 1 further comprising a first step of rendering hydrophilic a silicon substrate surface and a III-V material substrate surface to be contacted together.

16. The method of claim 1 wherein the III-V material substrate comprises a GaAs substrate.

17. The method of claim 1 wherein the III-V material substrate comprises an InP substrate.

18. The method of claim 1 wherein the step of thinning the silicon substrate comprises thinning the silicon substrate to a thickness of less than about 1 micron.

19. The method of claim 18 wherein the step of thinning the silicon substrate comprises thinning the silicon substrate to a thickness of less than about 5000 angstroms.

20. The method of claim 19 wherein the step of thinning the silicon substrate comprises thinning the silicon substrate to a thickness of less than about 2000 angstroms.

21. The method of claim 1 wherein the silicon substrate comprises a silicon-on-insulator (SOI) substrate.

22. The method of claim 1 wherein the silicon substrate comprises a separation-by-implantation-of-oxygen (SIMOX) substrate configuration.

23. The method of claim 1 wherein contacting the silicon substrate together with the III-V material substrate comprises applying pressure to the silicon substrate and the III-V material substrate as the silicon substrate and the III-V material substrate are contacted together.

24. The method of claim 1 further comprising a last step of annealing the III-V material substrate and the thinned silicon substrate at a second temperature that is greater than the first temperature.

25. The method of claim 24 wherein the second temperature is greater than about 200° C.

26. The method of claim 25 wherein the second temperature is greater than about 350° C.

27. The method of claim 1 further comprising a last step of annealing the III-V material substrate and the thinned silicon substrate at a second temperature at which further thermal processing of the substrates is to be carried out.

* * * * *